(12) United States Patent
Dube et al.

(10) Patent No.: US 8,685,845 B2
(45) Date of Patent: Apr. 1, 2014

(54) EPITAXIAL GROWTH OF SILICON DOPED WITH CARBON AND PHOSPHORUS USING HYDROGEN CARRIER GAS

(75) Inventors: Abhishek Dube, Fishkill, NY (US); Ashima B. Chakravarti, Hopewell Junction, NY (US); Jinghong H. Li, Poughquag, NY (US); Rainer Loesing, Newburgh, NY (US); Dominic J. Schepis, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 373 days.

(21) Appl. No.: 12/860,236

(22) Filed: Aug. 20, 2010

(65) Prior Publication Data
US 2012/0043556 A1 Feb. 23, 2012

(51) Int. Cl.
*H01L 21/20* (2006.01)

(52) U.S. Cl.
USPC .................................. 438/508; 257/E21.092

(58) Field of Classification Search
USPC .............. 257/77, E21.092, E29.068; 438/508
See application file for complete search history.

(56) References Cited

U.S. PATENT DOCUMENTS

| | | | |
|---|---|---|---|
| 4,561,119 A | 12/1985 | Epworth | |
| 5,374,412 A | 12/1994 | Pickering et al. | |
| 5,463,978 A * | 11/1995 | Larkin et al. | 117/89 |
| 5,964,943 A | 10/1999 | Stein et al. | |
| 6,063,186 A | 5/2000 | Irvine et al. | |
| 6,329,088 B1 | 12/2001 | Landini et al. | |
| 6,346,732 B1 * | 2/2002 | Mizushima et al. | 257/382 |
| 6,488,771 B1 | 12/2002 | Powell et al. | |
| 7,247,513 B2 | 7/2007 | Kordina | |
| 7,289,865 B2 * | 10/2007 | Bauer | 700/121 |
| 7,598,178 B2 | 10/2009 | Samoilov et al. | |
| 2003/0024471 A1 * | 2/2003 | Talin et al. | 117/92 |
| 2004/0222501 A1 | 11/2004 | Kordina | |
| 2006/0166475 A1 * | 7/2006 | Mantl | 438/590 |
| 2006/0205194 A1 * | 9/2006 | Bauer | 438/542 |
| 2006/0267024 A1 * | 11/2006 | Murphy et al. | 257/77 |
| 2007/0281411 A1 * | 12/2007 | Murthy et al. | 438/197 |
| 2008/0022924 A1 * | 1/2008 | Kim et al. | 117/85 |
| 2010/0035419 A1 * | 2/2010 | Dube et al. | 438/494 |

FOREIGN PATENT DOCUMENTS

| | | |
|---|---|---|
| JP | 5006877 | 1/1993 |
| JP | 2003-115800 | 4/2003 |

* cited by examiner

*Primary Examiner* — Wael Fahmy
*Assistant Examiner* — Sarah Salerno
(74) *Attorney, Agent, or Firm* — Scully, Scott, Murphy & Presser, P.C.; Joseph P. Abate, Esq.

(57) ABSTRACT

A method for depositing epitaxial films of silicon carbon (Si:C). In one embodiment, the method includes depositing an n-type doped silicon carbon (Si:C) semiconductor material on a semiconductor deposition surface using a deposition gas precursor composed of a silane containing gas precursor, a carbon containing gas precursor, and an n-type gas dopant source. The deposition gas precursor is introduced to the semiconductor deposition surface with a hydrogen ($H_2$) carrier gas. The method for depositing epitaxial films may include an etch reaction provided by hydrogen chloride (HCl) gas etchant and a hydrogen ($H_2$) carrier gas.

15 Claims, 5 Drawing Sheets

EPITAXIAL GROWTH OF SILICON DOPED WITH CARBON AND PHOSPHORUS USING HYDROGEN CARRIER GAS

BACKGROUND

This invention relates to silicon doped with carbon (Si:C), and methods for depositing silicon doped with carbon (Si:C).

As smaller transistors are manufactured, ultra shallow source/drain junctions are becoming more challenging to produce. Selective epitaxial deposition is often utilized to form epilayers of silicon containing materials (e.g., Si, SiGe and Si:C) into the junctions. Generally, selective epitaxial deposition permits growth of epilayers on silicon moats with no growth on dielectric areas. Selective epitaxy can be used within semiconductor devices, such as elevated source/drains, source/drain extensions, contact plugs or base layer deposition of bipolar devices.

SUMMARY

Epitaxial growth of n-type conductivity silicon doped with carbon (Si:C) is provided by a chemical vapor deposition process (CVD), in which the carrier gas for the deposition gas precursors is provided by hydrogen ($H_2$). In one embodiment, the epitaxial deposition process includes depositing an n-type doped silicon carbon (Si:C) semiconductor material on a semiconductor deposition surface using a depositing gas precursor comprising a silane containing gas precursor, a carbon containing gas precursor, and an n-type gas dopant source, wherein the deposition gas precursor is introduced to the semiconductor deposition surface with a hydrogen ($H_2$) carrier gas.

In another aspect, a semiconductor device is provided that in one embodiment includes a mono crystalline silicon layer having a carbon concentration ranging from $10^{20}$ atoms/cm$^3$ to $10^{22}$ atoms/cm$^3$, and a phosphorus concentration ranging from $10^{15}$ atoms/cm$^3$ to $10^{21}$ atoms/cm$^3$, in which the monocrystalline silicon layer has a stacking defect density that ranges from $10^{12}$ defects/cm$^3$ to $10^{14}$ defects/cm$^3$.

In yet another aspect, a semiconductor device is provided that in one embodiment includes a monocrystalline silicon layer having a carbon concentration ranging from $10^{20}$ atoms/cm$^3$ to $10^{22}$ atoms/cm$^3$ and a phosphorus concentration ranging from $10^{15}$ atoms/cm$^3$ to $10^{21}$ atoms/cm$^3$, wherein the monocrystalline silicon layer has a surface that ranges from 0.5 Å RMS to 4.0 Å RMS.

DESCRIPTION OF THE DRAWINGS

These and other features, objects, and advantages of the present invention will become apparent upon consideration of the following detailed description of the invention when read in conjunction with the drawing in which.

DETAILED DESCRIPTION

Figure 1:
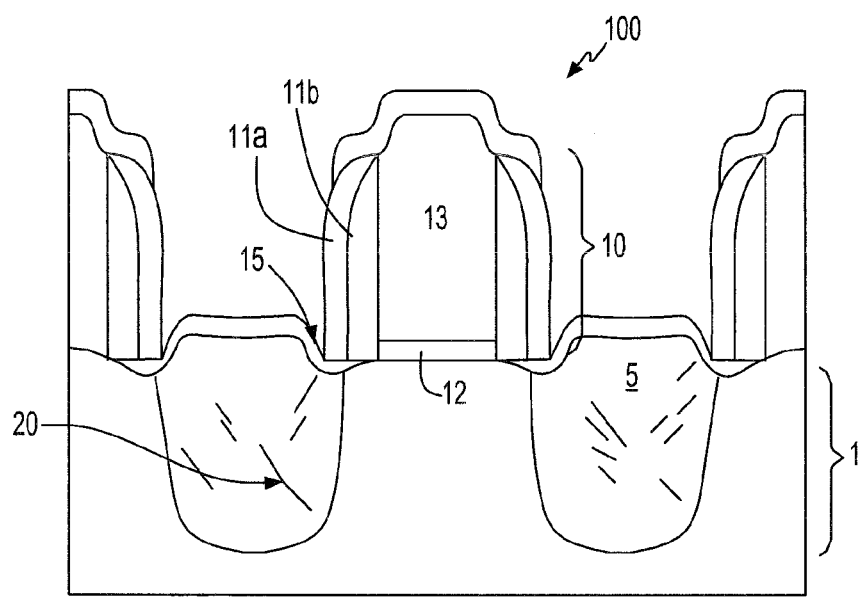
FIG. 1 is a side cross-sectional view depicting a semiconductor device including well regions that are composed of n-type conductivity silicon doped with carbon (Si:C), wherein the upper surface of the well regions is facetted, and the n-type conductivity silicon doped with carbon (Si:C) is formed using a carrier gas composed of nitrogen ($N_2$).

Detailed embodiments of the present invention are disclosed herein; however, it is to be understood that the disclosed embodiments are merely illustrative of the invention that may be embodied in various forms. In addition, each of the examples given in connection with the various embodiments of the invention is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the present invention.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. For purposes of the description hereinafter, the terms "upper", "lower", "right", "left", "vertical", "horizontal", "top", "bottom", and derivatives thereof shall relate to the invention, as it is oriented in the drawing figures. The terms "overlying", "atop", "positioned on" or "positioned atop" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

An epitaxial growth process is provided for depositing silicon doped with carbon (Si:C) that is doped with an n-type dopant, i.e., n-type conductivity silicon doped with carbon (Si:C), in which the carrier gas for the epitaxial growth process is hydrogen ($H_2$). "Epitaxial growth and/or deposition" means the growth of a semiconductor material on a deposition surface of a semiconductor material, in which the semiconductor material being grown has the same crystalline characteristics as the semiconductor material of the deposition surface. The term "Si:C" or "carbon-doped silicon" or "silicon doped with carbon" as used herein refers to silicon having substitutional carbon atoms located therein. The substitutional carbon atoms and the silicon atoms form a silicon-carbon alloy, which is a semiconductor material. As used herein, "n-type" refers to the addition of impurities that contribute free electrons to an intrinsic semiconductor. In a silicon containing substrate, such as silicon, examples of n-type dopants, i.e., impurities, include, but are not limited to, antimony, arsenic and phosphorous. A hydrogen carrier gas is a carrier gas that is composed of greater than 99% hydrogen gas ($H_2$). Allowable concentrations of impurities in the carrier gas are limited to no greater than 1%, which may include oxygen, water, hydrocarbons, or combinations thereof. A hydrogen ($H_2$) carrier gas is free of nitrogen ($N_2$).

Generally, a selective epitaxy process involves a deposition reaction and an etch reaction. The deposition reaction includes a silane containing precursor, a carbon containing precursor, an n-type dopant gas source and a carrier gas. The etch reaction includes hydrogen chloride (HCl) gas, and a carrier gas. In one embodiment, the carrier gas for the deposition reaction and the etch reaction is hydrogen ($H_2$). In some embodiments, in comparison to using nitrogen ($N_2$) as a carrier gas, the use of hydrogen ($H_2$) as a precursor gas for epitaxial growth of n-type conductivity silicon doped with carbon (Si:C) provides reduced stacking defects, reduced facet formation, reduced overgrowth of well regions, i.e., reduced (110) sidewall growth, and independent control of the n-type dopant concentration, e.g., phosphorus concentration, and the carbon dopant concentration.

FIG. 1 depicts a semiconductor device 100, such as a field effect transistor (FET), including well regions 5 composed of n-type conductivity silicon doped with carbon (Si:C), wherein the upper surface of the well regions 5 is facetted. As used herein, "semiconductor device" refers to an intrinsic semiconductor material that has been doped, that is, into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentrations in an extrinsic semiconductor determines the conductivity type of the semiconductor. As used herein a "field effect transistor" is a transistor in which output current, i.e., source-drain current, is controlled by the voltage applied to the gate structure 10. A field effect transistor has three terminals, i.e., gate structure 10, source and drain. A "gate structure" is a structure used to control output current (i.e. flow of carriers in the channel) of a semiconducting device through electrical or magnetic fields. As used herein, the term "source region" is a doped region in the semiconductor device 100, in which majority carriers are flowing into the channel. As used herein, the term "drain region" means a doped region in semiconductor device 100 located at the end of the channel, in which carriers are flowing out of the transistor through the drain region. In the structure depicted in FIG. 1, at least a portion of the source region and the drain region are present in the well regions 5 composed of the n-type conductivity silicon doped with carbon (Si:C).

The facet 15 is the recess that is formed at the surface of the n-type conductivity doped epitaxial Si:C well regions 5 that is positioned adjacent to the gate structure 10. The well regions 5 of n-type conductivity silicon doped with carbon (Si:C) having the facetted upper surface are formed by an epitaxial growth process that employed nitrogen ($N_2$) as a carrier gas for the deposition and etch reactions. The n-type dopant is phosphorus. The deposition reaction that produces the facetted surface depicted in FIG. 1 includes methylsilane ($H_3C$—$SiH_3$) and phosphine ($PH_3$) in a nitrogen ($N_2$) carrier gas, wherein the methylsilane ($H_3C$—$SiH_3$) provides both the silane containing precursor gas and the carbon containing precursor gas, and the phosphine ($PH_3$) provides phosphorus as an n-type dopant gas source. The methysilane ($H_3C$—$SiH_3$) is introduced to the deposition surface at a flow rate of 400 sccm and the phosphine ($PH_3$) is introduced to the deposition surface at a flow rate of 200 sccm. Growth in $H_2$ carrier suppresses the formation of facets due to increased growth of the material from the bottom of the Si recess, i.e., a greater growth rate at the bottom of the Si recess than the recess sidewalls.

Figure 2:
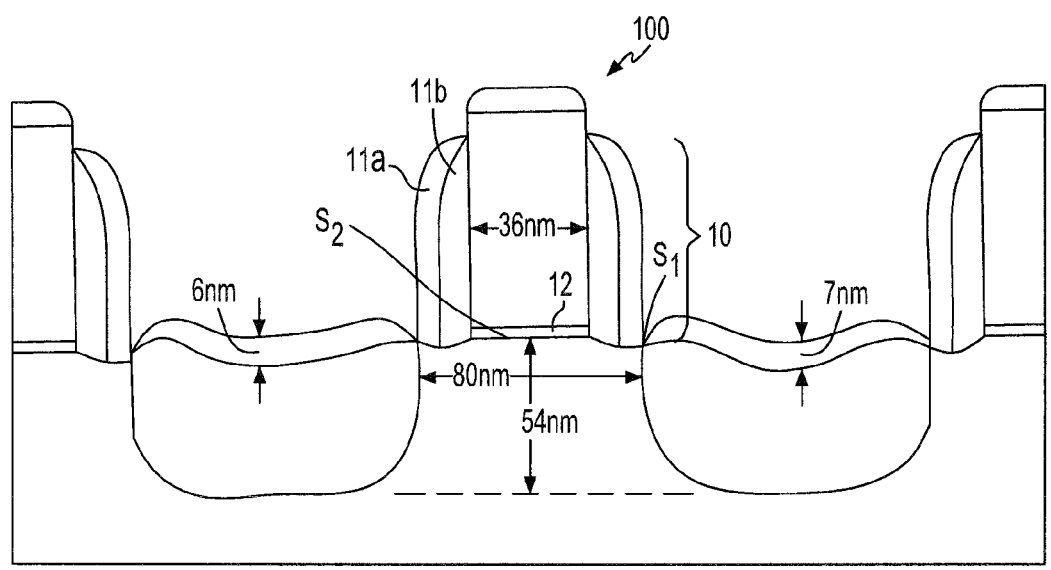
FIG. 2 is a side cross-sectional view depicting a semiconductor device including well regions composed of n-type conductivity silicon doped with carbon (Si:C), wherein the upper surface of the well regions is not facetted, and the n-type conductivity silicon doped with carbon (Si:C) is formed using a carrier gas composed of hydrogen ($H_2$), in accordance with one embodiment of the present disclosure.

FIG. 2 depicts one embodiment of a semiconductor device including well regions 5 composed of n-type conductivity silicon doped with carbon (Si:C), wherein the upper surface of the well regions 5 is not facetted. In one embodiment, the n-type conductivity silicon doped with carbon (Si:C) that is present in the well regions 5 is formed using an epitaxial deposition process, in which the carrier gas for the deposition precursors is composed of hydrogen ($H_2$). By "non facetted" it is meant that the upper surface Si of the epitaxially grown n-type conductivity silicon doped with carbon (Si:C) that is adjacent to the gates structure 10 is coplanar with the upper surface S2 of the semiconductor substrate 1 that the gate structure 10 is present on. Therefore, in a non-facetted surface there is no recess present at the upper surface of the epitaxially grown n-type conductivity silicon doped with carbon (Si:C) at the interface of the epitaxial material and the semiconductor material of the semiconductor substrate 1.

In one embodiment, the epitaxial deposition process that provides a non-facetted surface begins with providing a gate structure 10 on a semiconductor substrate 1. Following the formation of the gate structure 10, recessed surfaces are formed in the semiconductor substrate 1 on opposing sides of the gate structure 10. In some embodiments, following the formation of the gate structure 10 and before recessing the surface of the semiconductor substrate 1, spacers (first and second spacers 11a, 11b) may be formed on the sidewalls of the gate structure 10. The spacers, i.e., first and second spacers 11a, 11b) are typically composed of a dielectric material, such as silicon nitride.

The semiconductor substrate 1 may include, but is not limited to, any semiconducting material such as Si, SiGe, GaAs, InAs and other like semiconductors. Layered semiconductors such as Si/Ge and Silicon-On-Insulators are also contemplated herein. Examples of silicon containing substrates include single crystal Si, polycrystalline Si, SiGe, amorphous Si, silicon-on-insulator substrates (SOI), SiGe-on-insulator (SGOI), annealed poly Si, and poly Si line structures. It is noted that the above examples of materials for the semiconductor substrate 1 are for illustrative purposes only. The semiconductor substrate 1 may be composed of any semiconductor material.

The gate structure 10 is typically composed of at least one gate dielectric layer 12 that is present on the surface of the semiconductor substrate 1, and at least one gate conductor 13. The at least one gate dielectric layer 12 may be a low-k dielectric having a dielectric constant of 4.0 or less, such as $SiO_2$, or the at least one gate dielectric layer may be a high-k dielectric having a dielectric constant that is greater than 4.0, such as $HfO_2$. The at least one gate conductor 13 may be composed of doped polysilicon, elemental metals, metal semiconductor alloys, or combinations thereof. The gate structure 10 can be formed using deposition, photolithography and etching processes. For example, the material layers for the at least one dielectric layer 12 and the at least one gate conductor 13 may be deposited on the semiconductor substrate 1. The material layers for the at least one gate dielectric 12, and the at least one gate conductor 13 are then patterned by photolithography and etching to provide the gate structure 10. In another embodiment, the gate structure 10 is formed using a replacement gate process.

In one embodiment, the well regions 5 that are composed of n-type conductivity silicon doped with carbon (Si:C) provides tensile strain inducing wells adjacent to the gate structure 10. The tensile strain inducing wells produce a tensile strain within the device channel of the n-type conductivity semiconductor device. In one example, the tensile strain is produced by a lattice mismatch between the smaller lattice dimension of epitaxially grown n-type conductivity silicon doped with carbon (Si:C), and the smaller lattice dimension of the silicon surface of the semiconductor substrate 1 on which the n-type conductivity silicon doped with carbon (Si:C) is epitaxially grown.

In one embodiment, the n-type conductivity silicon doped with carbon (Si:C) are formed on recessed surfaces of the semiconductor substrate 1 adjacent to the gate structure 10. The recessed surfaces of the semiconductor substrate 1 may be formed by depositing a protective dielectric layer (not shown), such as silicon nitride ($Si_3N_4$), over the semiconductor substrate 1, etching the protective dielectric layer to expose a surface of the semiconductor substrate 1 that is adjacent to the gate structure 10, and using an etch process that is selective to at least the protective dielectric layer to recess the exposed surfaces of the semiconductor substrate 1 to provide a recessed surface on each side of the gate structure 10.

In one embodiment, the etch process recesses the exposed surface of the semiconductor substrate 1 selective to the protective dielectric layer, such as reactive ion etch (RIE). One example of an anisotropic etch that is suitable for forming the recessed surfaces of the semiconductor substrate is reactive ion etch (RIE). In one embodiment, the etch process continues until the recessed surface of the semiconductor substrate 1 is vertically offset from the surface of the semiconductor substrate 1 that the gate structure 10 is present on by a dimension ranging from 5 nm to 60 nm. In some embodiments, the recessed surface of the semiconductor substrate 1 is vertically offset from the surface of the semiconductor substrate 1 on which the gate structure 10 is present on by a dimension ranging from 15 nm to 50 nm. Typically, the recessed surfaces of the semiconductor substrate 1 are composed of monocrystalline silicon. The epitaxially deposited n-type conductivity silicon doped with carbon (Si:C) has the same crystalline structure as the recessed surfaces of the semiconductor substrate 1. Therefore, in the embodiments in which the recessed surface has a monocrystalline crystal structure, the n-type conductivity silicon doped with carbon (Si:C) that is grown on the recessed surfaces of the semiconductor substrate 1 have a monocrystalline crystal structure.

Still referring to FIG. 2, following the formation of the recessed surfaces of the semiconductor substrate 5, the recesses that are formed in the semiconductor substrate 1 are filled with an epitaxially deposited n-type conductivity silicon doped with carbon (Si:C) material to provide the well regions 5. In one embodiment, the epitaxial deposition process includes a silane containing precursor, a carbon containing precursor, an n-type gas dopant source and a hydrogen ($H_2$) carrier gas, in which the epitaxial deposition process provides a well region 5 with a non-faceted upper surface.

Figure 3:
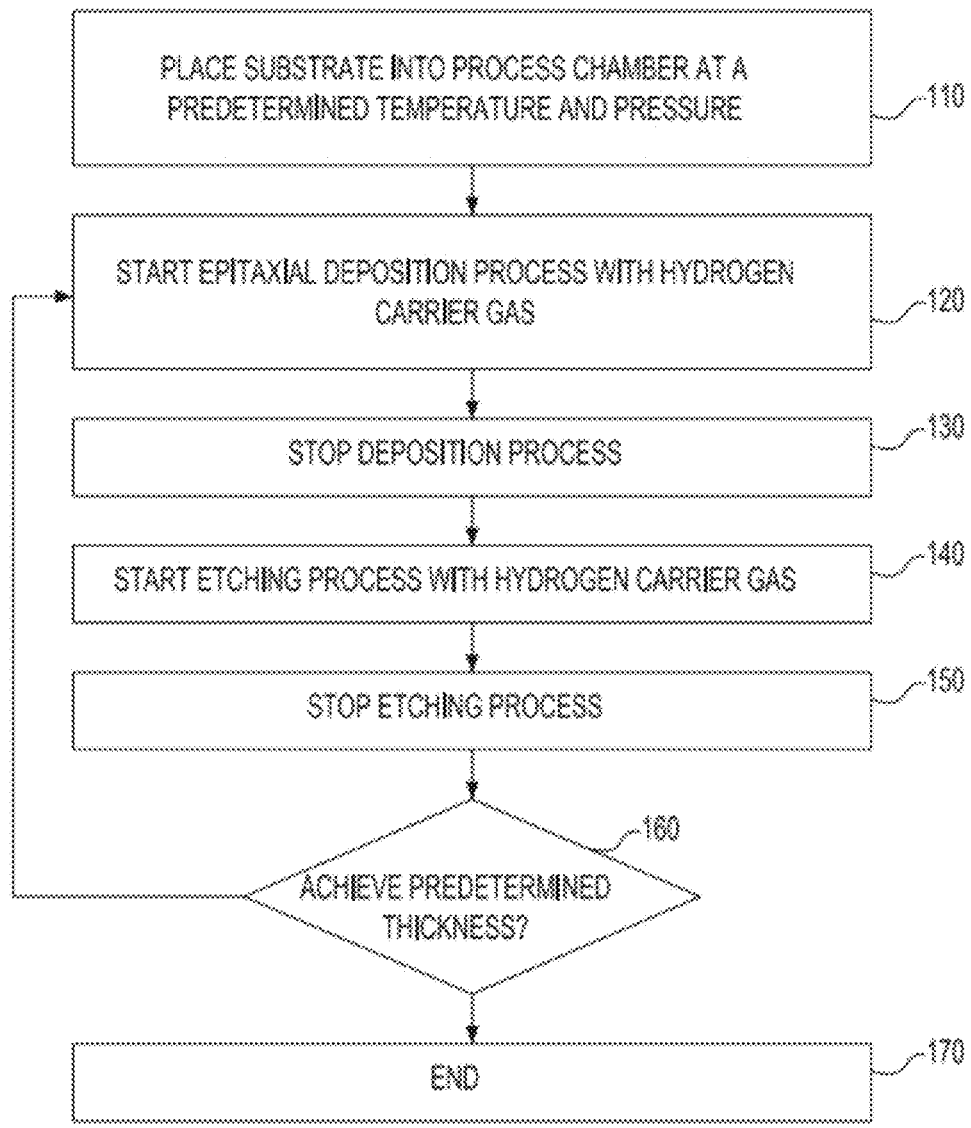
FIG. 3 is a flow chart describing a process to epitaxially deposit n-type conductivity silicon doped with carbon (Si:C) using a carrier gas composed of hydrogen ($H_2$), in accordance with one embodiment of the present disclosure.

FIG. 3 illustrates one embodiment of an epitaxial deposition process sequence used to deposit on n-type conductivity silicon doped with carbon (Si:C) well on recessed surfaces of the semiconductor substrate using a hydrogen ($H_2$) carrier gas. In one embodiment, the epitaxial deposition process includes step 110 for loading the semiconductor substrate including the recessed semiconductor surfaces into a process chamber and adjusting the conditions within the process chamber to a desired temperature and pressure. Step 120 provides a deposition process to form an epitaxial layer of n-type conductivity silicon doped with carbon (Si:C) on the recessed monocrystalline silicon surface of the semiconductor substrate. During step 130, the deposition process is terminated. Step 140 provides an etching process to etch the surface of the semiconductor substrate. The etching step either minimizes or completely removes any polycrystalline or amorphous material that is deposited by the epitaxial deposition process, wherein the etching process is selective to the epitaxially deposited monocrystalline n-type conductivity silicon doped with carbon (Si:C). During step 150, the etching process is terminated. The thickness of the epitaxial layer of monocrystalline n-type conductivity silicon doped with carbon (Si:C) is determined during step 160. If the predetermined thickness of the epitaxial layer of the n-type conductivity silicon doped with carbon (Si:C) has been deposited, the epitaxial process is terminated at step 170. However, if the predetermined thickness is not achieved, then steps 120-160 are repeated as a cycle until the predetermined thickness is achieved.

A semiconductor substrate having recessed surfaces is loaded in to a process chamber during step 110. The semiconductor substrate usually contains a monocrystalline crystal structure on the recessed surfaces of the semiconductor substrate, and includes at least one secondary surface that is non-monocrystalline, such as a polycrystalline or amorphous surface. Polycrystalline or amorphous surfaces may include dielectric materials, such as oxides or nitrides, specifically silicon oxide or silicon nitride, as well as amorphous silicon surfaces.

In one embodiment, the epitaxial process begins by adjusting the process chamber containing the semiconductor substrate including the recessed substrate surfaces to a predetermined temperature and pressure during step 110. The temperature is tailored to the particular conducted process. Generally, the process chamber is maintained at a consistent temperature throughout the epitaxial process. In some embodiments, the process chamber is kept at a temperature in the range from 250° C. to 1,000° C. In another embodiment, the process chamber is kept at a temperature in the range from 500° C. to 800° C. In yet another embodiment, the process chamber is kept at a temperature in the range from 550° C. to 750° C. It is noted that the above temperatures are provided for illustrative purposes only, as the appropriate temperature to conduct epitaxial deposition may depend on the particular precursors used to deposit and/or etch the silicon containing materials.

The etch process reaction that provides the non-facetted n-type conductivity silicon doped with carbon (Si:C) that is depicted in FIG. 2 includes a hydrogen chloride (HCl) gas. Hydrogen chloride (HCl) gas works well as an etchant for silicon containing materials at higher pressures than processes using chlorine ($Cl_2$) gas as an etchant, such as the etch process used to provide the structure depicted in FIG. 1. More specifically, in some embodiments, the etch process reaction removes polycrystalline and amorphous epitaxially formed semiconductor material that may be formed on dielectric surfaces, such as dielectric spacers, isolation regions, and dielectric cap structures, selective to the epitaxially formed monocrystalline n-type conductivity silicon doped with carbon (Si:C) that is formed on monocrystalline deposition surfaces, such as the monocrystalline recessed silicon surfaces of the semiconductor substrate. Etch processes using chlorine ($Cl_2$) gas as an etchant employ a pressure ranging from 1 Torr to about 50 Torr, typically being on the order of 10 Torr. In comparison, etch processes using a hydrogen chloride (HCl) gas etchant employ a pressure ranging from 250 Torr to 450 Torr. In another embodiment, the etch process using a hydrogen chloride (HCl) gas etchant employ a pressure ranging from 300 Torr to 400 Torr. Therefore, to provide a non-facetted n-type conductivity silicon doped with carbon (Si:C) depicted in FIG. 2, the pressure of the process chamber is increased to provide one of the aforementioned pressures that are suitable for etching with hydrogen chloride (HCl) gas. Referring to FIG. 3, the pressure may fluctuate during and between process steps 110-160, but is generally maintained constant. In one embodiment, the etch reaction comprises 80% hydrogen ($H_2$) carrier gas and 20% hydrogen chloride (HCl) gas etchant.

Referring to FIG. 3, the deposition process is conducted during step 120. The deposition surface, i.e., recessed surfaces of the semiconductor substrate, is exposed to a deposition gas to form an epitaxial layer of n-type conductivity silicon doped with carbon (Si:C) on the monocrystalline surface of the recessed surface of the silicon semiconductor substrate. In one embodiment, the deposition surface is exposed to the deposition precursor gas for a period of time ranging from 0.5 seconds to 30 seconds. In another embodiment, the deposition surface is exposed to the deposition precursor gas for a period of time ranging from 1 second to 20 seconds. In yet another embodiment, the deposition surface is exposed to the deposition precursor gas for a period of time ranging from 5 seconds to 10 seconds. The specific exposure time of the deposition process is determined in relation to the exposure time during the etching process in step 140, as well as particular precursors and temperature used in the process. Generally, the semiconductor substrate is exposed to the deposition gas long enough to form a thickness of an epitaxial layer of n-type conductivity silicon doped with carbon (Si:C) layer while forming a minimal thickness of a polycrystalline or amorphous material that may be easily etched away during subsequent step 140.

The deposition precursor gas contains at least a silane containing gas precursor, a carbon containing gas precursor, an n-type gas dopant source and a hydrogen ($H_2$) carrier gas. As used herein, "n-type conductivity" refers to the addition of impurities that contribute free electrons to an intrinsic semiconductor. In a silicon containing material examples of n-type dopants, i.e., impurities, include but are not limited to, antimony, arsenic and phosphorous. In one example, the n-type dopant is phosphorus.

In one embodiment, the silicon source, i.e., silane containing gas precursor, is usually provided into the process chamber at a rate in a range from 5 sccm to 500 sccm. In another embodiment, the silicon source is provided into the process chamber at a rate in the range from 10 sccm to 300 sccm. In yet another embodiment, the silicon source is usually provided into the process chamber at a rate in the range from 50 sccm to 200 sccm, for example, 100 sccm.

Silicon sources, i.e., silane containing gas precursor, useful in the deposition gas to deposit silicon containing compounds include silanes, halogenated silanes and organosilanes. Silane containing gas precursors include silane ($SiH_4$) and higher silanes with the empirical formula $Si_xH_{(2x+2)}$, such as disilane ($Si_2H_6$), trisilane ($Si_3H_8$), and tetrasilane ($Si_4H_{10}$), as well as others. Halogenated silanes include compounds with the empirical formula $X'_ySi_xH_{(2x+2-y)}$, where X'=F, Cl, Br or I, such as hexachlorodisilane ($Si_2Cl_6$), tetrachlorosilane ($SiCl_4$), dichlorosilane ($Cl_2SiH_2$) and trichlorosilane ($Cl_3SiH$). Organosilanes include compounds with the empirical formula $R_ySi_xH_{(2x+2-y)}$, where R=methyl, ethyl, propyl or butyl, such as methylsilane (($CH_3$)$SiH_3$), dimethylsilane (($CH_3$)$_2SiH_2$), ethylsilane (($CH_3CH_2$)$SiH_3$), methyldisilane (($CH_3$)$Si_2H_5$), dimethyldisilane (($CH_3$)$_2Si_2H_4$) and hexamethyldisilane (($CH_3$)$_6Si_2$).

The silicon source, i.e., silane containing gas precursor, is provided into the process chamber along with a hydrogen ($H_2$) carrier gas. In one embodiment, the carrier gas has a flow rate ranging from 1 slm (standard liters per minute) to 100 slm. In another embodiment, the carrier gas has a flow rate ranging from 5 slm to 75 slm. In yet another embodiment, the carrier gas has a flow rate ranging from 10 slm to 50 slm, for example, about 25 slm. In one embodiment, the carrier gas is typically 75-90% of the total gas flows being employed in the deposition and etch reactions.

The deposition precursor gas used during step 120 may also contain a carbon source, i.e., carbon containing gas precursor. The introduction of carbon into the silicon being deposited by the silane containing gas precursor reduces the lattice dimension of the crystal structure of the epitaxially deposited n-type conductivity silicon doped with carbon (Si:C) well regions. In one example, tensile strain is produced by a lattice mismatch between the smaller lattice dimension of epitaxially grown n-type conductivity silicon doped with carbon (Si:C), and the smaller lattice dimension of the silicon surface of the semiconductor substrate 1 on which the n-type conductivity silicon doped with carbon (Si:C) is being epitaxially grown.

The carbon containing gas precursor may be introduced to the process chamber at a rate in the range of 0.1 sccm to 20 sccm. In another embodiment, the carbon containing gas precursor is introduced to the semiconductor deposition surface with a flow rate ranging from 0.2 sccm to 20 sccm. In one embodiment, the carbon containing precursor is introduced to the process chamber at a rate in the range of 1 sccm to 5 sccm. In one example, the carbon containing precursor is introduced to the process chamber at 2 sccm. Carbon sources, i.e., carbon containing precursors that are useful to deposit silicon containing compounds include organosilanes, alkyls, alkenes and alkynes of ethyl, propyl and butyl. Such carbon sources include methylsilane ($CH_3SiH_3$), dimethylsilane (($CH_3$)$_2SiH_2$), ethylsilane ($CH_3CH_2SiH_3$), methane ($CH_4$), ethylene ($C_2H_4$), ethyne ($C_2H_2$), propane ($C_3H_8$), propene ($C_3H_6$), butyne ($C_4H_6$), as well as others. The carbon concentration of an epitaxial layer is in the range from 0.5% to 5%. In another embodiment, the carbon concentration ranges from 1% to 3%. In one example, the carbon concentration is 1.5%. In one embodiment, the carbon concentration may be graded within the epitaxially formed semiconductor layer.

The carbon containing precursor is provided into the process chamber along with a hydrogen (H$_2$) carrier gas. In one embodiment, the carrier gas has a flow rate that ranges from 1 slm (standard liters per minute) to 100 slm. In another embodiment, the carrier gas has a flow rate ranging from 5 slm to 75 slm. In yet another embodiment, the carrier gas has a flow rate ranging from 10 slm to 50 slm, for example, about 25 slm. In one embodiment, the carrier gas is typically 75% to 90% of the total gas flows being employed in the deposition and etch reactions.

The deposition precursor gases used during step 120 may further include at least one n-type dopant compound, i.e., n-type gas dopant source, to provide a source of elemental dopant, such as arsenic, phosphorous, and gallium. In one example, the epitaxial deposited silicon containing compound is doped n-type, such as with phosphorous and/or arsenic to a concentration in the range from $10^{15}$ atoms/cm$^3$ to $10^{21}$ atoms/cm$^3$. The n-type dopant of in the well regions of the n-type conductivity silicon doped with carbon (Si:C) provides the source and drain regions of the semiconductor device, e.g., n-type field effect transistor (nFET).

The n-type gas dopant source is usually provided into the process chamber during step 120 at a rate in the range from 0.1 sccm to 20 sccm. In one embodiment, the n-type dopant source is provided into the process chamber at a rate ranging from 0.5 sccm to 10 sccm. In another embodiment, the n-type dopant source is provided into the process chamber at a rate ranging from 1 sccm to 5 sccm. In one example, the n-type dopant source is provided into the process chamber at a rate of 2 sccm. The n-type gas dopant source may include arsine (AsH$_3$), phosphine (PH$_3$) and alkylphosphines, such as with the empirical formula R$_x$PH$_{(3-x)}$, where R=methyl, ethyl, propyl or butyl and x=1, 2 or 3. Alkylphosphines include trimethylphosphine ((CH$_3$)$_3$P), dimethylphosphine ((CH$_3$)$_2$PH), triethylphosphine ((CH$_3$CH$_2$)$_3$P) and diethylphosphine ((CH$_3$CH$_2$)$_2$PH).

During step 130, the deposition process is terminated. In one example, the process chamber may be flushed with a purge gas or the carrier gas and/or the process chamber may be evacuated with a vacuum pump. The purging and/or evacuating processes remove excess deposition gas, reaction by-products and other contaminates. In another example, once the deposition process has terminated, the etching process in step 140 is immediately started without purging and/or evacuating the process chamber.

The etching process in step 140 removes silicon containing materials deposited during step 120 from the semiconductor substrate surface. The etching process removes both amorphous and/or polycrystalline epitaxially deposited materials selective to monocrystalline epitaxially deposited materials. The time duration of the etching process is balanced with the time duration of the deposition process to result in net deposition of the epitaxial layer selectively formed on desired areas of the substrate. Therefore, the net result of the deposition process in step 120 and etching process in step 140 is to form selective and epitaxially grown monocrystalline silicon containing material while minimizing, if any, growth of polycrystalline silicon containing material.

During step 140, in one embodiment, the semiconductor substrate is exposed to the etching gas for a period of time in the range from 10 seconds to 90 seconds. In another embodiment, the semiconductor substrate is exposed to the etching gas for a period from 20 seconds to 60 seconds. In an even further embodiment, the semiconductor substrate is exposed to the etching gas for a period from 30 seconds to 45 seconds.

The etching reaction includes hydrogen chloride (HCl) etchant and hydrogen (H$_2$) carrier gas. In one example, the etch gas comprises 45% hydrogen chloride (HCl) etchant and 55% hydrogen (H$_2$) carrier gas. In one embodiment, the hydrogen chloride (HCl) etchant is provided into the process chamber at a rate in the range from 1000 sccm to 10000 sccm. In another embodiment, the hydrogen chloride (HCl) etchant is provided into the process chamber at a rate in the range of from 2000 sccm to 4000 sccm. In yet another embodiment, the hydrogen chloride (HCl) etchant is provided into the process chamber at a rate in the range from 3000 sccm to 6000 sccm. In one example, the hydrogen chloride etchant is provided into the process chamber at a rate on the order of 5000 sccm. In one embodiment, the hydrogen chloride (HCl) gas etchant has a flow rate ranging from 10 sccm to 700 sccm.

The hydrogen carrier gas is composed of 99% hydrogen, and in some embodiments may be as high as 100% hydrogen. When present impurities in the hydrogen carrier gas may total 1%, and may include water, oxygen, hydrocarbons, and combinations thereof. In one embodiment, the hydrogen (H$_2$) carrier gas has a flow rate in the range from 1 slm to 100 slm. In another embodiment, the hydrogen (H$_2$) carrier gas has a flow rate in the range from 1 slm to 75 slm. In yet another embodiment, the hydrogen (H$_2$) carrier gas has a flow rate that ranges from 10 slm to 50 slm. In one example, the hydrogen (H$_2$) carrier gas has a flow rate on the order of 5 slm.

The hydrogen chloride (HCl) etch process employs a pressure ranging from 250 Torr to 450 Torr. In another embodiment, the etch process using a hydrogen chloride (HCl) gas etchant employs a pressure ranging from 300 Torr to 400 Torr. In one embodiment, the temperature of the hydrogen chloride (HCl) etch process is 750° C. or less. In another embodiment, the temperature of the hydrogen chloride (HCl) etch process is 650° C. or less. In one example, the temperature of the hydrogen chloride (HCl) etch process is 600° C.

The etching process is terminated during step 150. In one example, the process chamber may be flushed with a purge gas or the carrier gas and/or the process chamber may be evacuated with a vacuum pump. The purging and/or evacuating processes remove excess etching gas, reaction by-products and other contaminates. In another example, once the etching process has terminated, step 160 is immediately started without purging and/or evacuating the process chamber.

The thicknesses of the n-type conductivity silicon doped with carbon (Si:C) layer may be determined during step 160. If the predetermined thicknesses are achieved, then epitaxial process is terminated at step 170. However, if the predetermined thicknesses are not achieved, then steps 120-160 are repeated as a cycle until the desired thicknesses are achieved. In one embodiment, the epitaxial n-type conductivity silicon doped with carbon (Si:C) layer is grown to have a thickness in a range from 10 Å to 2,000 Å In another embodiment, the epitaxial n-type conductivity silicon doped with carbon (Si:C) layer is grown to have a thickness in a range from 100 Å to 1,500 Å. In yet another embodiment, the epitaxial n-type conductivity silicon doped with carbon (Si:C) layer is grown to have a thickness in a range from 400 Å to 1,200 Å.

The epitaxial deposition process illustrated in FIG. 3 deposits n-type conductivity silicon doped with carbon (Si:C) well regions 5 on the recessed surfaces of the semiconductor substrate 1 using a hydrogen (H$_2$) carrier gas, wherein the n-type conductivity silicon doped with carbon (Si:C) well regions 5 have a non-faceted upper surface, as depicted in FIG. 2. Specifically, the non-facetted n-type conductivity doped with carbon (Si:C) well regions 5 are formed with precursor gasses including methylsilane (H$_3$C—SiH$_3$) and phosphine (PH$_3$) in a hydrogen (H$_2$) carrier gas, wherein the methylsilane (H$_3$C—SiH$_3$) provides both the silicon source and the carbon dopant source, and the phosphine (PH$_3$) provides phosphorus as an n-type dopant. The methysilane (H$_3$C—SiH$_3$) is introduced to the deposition surface at a flow rate of about 400 sccm and a phosphine (PH$_3$) flow rate of about 200 sccm.

The epitaxial process illustrated in FIG. 3 deposits n-type conductivity silicon doped with carbon (Si:C) well regions with a hydrogen (H$_2$) carrier gas that provides a reduced density of stacking defects, when compared to a similarly deposited n-type conductivity silicon doped with carbon (Si:C) wells formed with a nitrogen carrier gas (N$_2$). FIG. 1 depicts well regions 5 having a high concentration of stacking defects 20 extending from the sidewalls of the semiconductor substrate 1 that are formed by the etch process that provides the recessed surfaces of the semiconductor substrate 1 on which the n-type conductivity silicon doped with carbon (Si:C) well regions 5 are formed. A "stacking defect" is a defect in single crystal materials, i.e., monocrystalline crystal structures, that results from misalignment of crystallographic planes. The stacking default density that results from the epitaxial deposition process of n-type conductivity silicon doped with carbon (Si:C) using a nitrogen carrier (N$_2$) gas ranges from $10^{15}$ defects/cm$^3$ to $10^{18}$ defects/cm$^3$.

In comparison, the well regions 5 composed of n-type conductivity silicon doped with carbon (Si:C) that are depicted in FIG. 2, and are formed by an epitaxial deposition process using a hydrogen carrier (H$_2$) gas are substantially free of stacking defects. In one embodiment, the well regions 5 composed of n-type conductivity silicon doped with carbon (Si:C) that are formed from an epitaxial deposition process using a hydrogen carrier (H$_2$) gas have a stacking defect density that ranges from $10^{10}$ defects/cm$^3$ to $10^{15}$ defects/cm$^3$. In another embodiment, the well regions 5 composed of n-type conductivity silicon doped with carbon (Si:C) that is formed by an epitaxial deposition process using a hydrogen carrier (H$_2$) gas have a stacking defect density that ranges from $10^{12}$ defects/cm$^3$ to $10^{14}$ defects/cm$^3$. By reducing the number of stacking defects in the well regions 5 that are composed of n-type conductivity silicon doped with carbon (Si:C), the hydrogen (H$_2$) anneal increases the amount of tensile strain that may be induced on the channel region of n-type semiconductor devices, such as nFET devices.

The hydrogen (H$_2$) carrier gas suppresses growth on the sidewalls of the Si recess, which is a Si (110) surface, as opposed to N$_2$ carrier gas where the growth rate from the Si (110) surface is much higher and leads to more defective growth. In reactions including N$_2$ carrier gas, the fast growth rate on the Si (110) planes of the recess sidewalls meet with growth from the bottom surface of the recess, which is a Si(100) surface, resulting in a facetted morphology. The (110) plane surface growth is defective and hence results in more stacking faults in deposition reactions using N$_2$ carrier gas. In the case of deposition reactions using a hydrogen (H$_2$) carrier gas, the majority of the growth of the deposited material is from the floor/bottom of the recess, which is a Si (100) surface, and not the sidewall of the recess.

In one embodiment, the reduced stacking defect density is provided by an epitaxial growth process that uses a hydrogen (H$_2$) carrier gas, in comparison to an epitaxial growth process that uses a nitrogen (N$_2$) carrier gas, because nitrogen (N$_2$) carrier gas introduces oxides to the exposed sidewall surfaces of the recessed semiconductor substrate during the epitaxial deposition process. The oxygen provides the source of stacking defects in the epitaxially grown n-type conductivity silicon doped with carbon (Si:C) well regions 5. Contrary to nitrogen (N$_2$) carrier gas, hydrogen (H$_2$) carrier gas does not introduce oxygen to the epitaxial deposition process, and therefore results in a low concentration of stacking defects. In some embodiments, the hydrogen (H$_2$) of the carrier gas is absorbed on the sidewalls of the recesses in which the n-type conductivity silicon doped with carbon (Si:C) is being deposited, wherein the adsorbed hydrogen (H$_2$) suppresses defect nucleation.

Epitaxial growth of the n-type conductivity silicon doped with carbon (Si:C) with a hydrogen (H$_2$) carrier gas also reduces (110) sidewall growth. The (110) sidewall growth is the growth of semiconductor material on the sidewall that is exposed by the etch process that provides the recessed surfaces of the semiconductor substrate on which the n-type conductivity silicon doped with carbon (Si:C) is epitaxially deposited.

Figure 4:
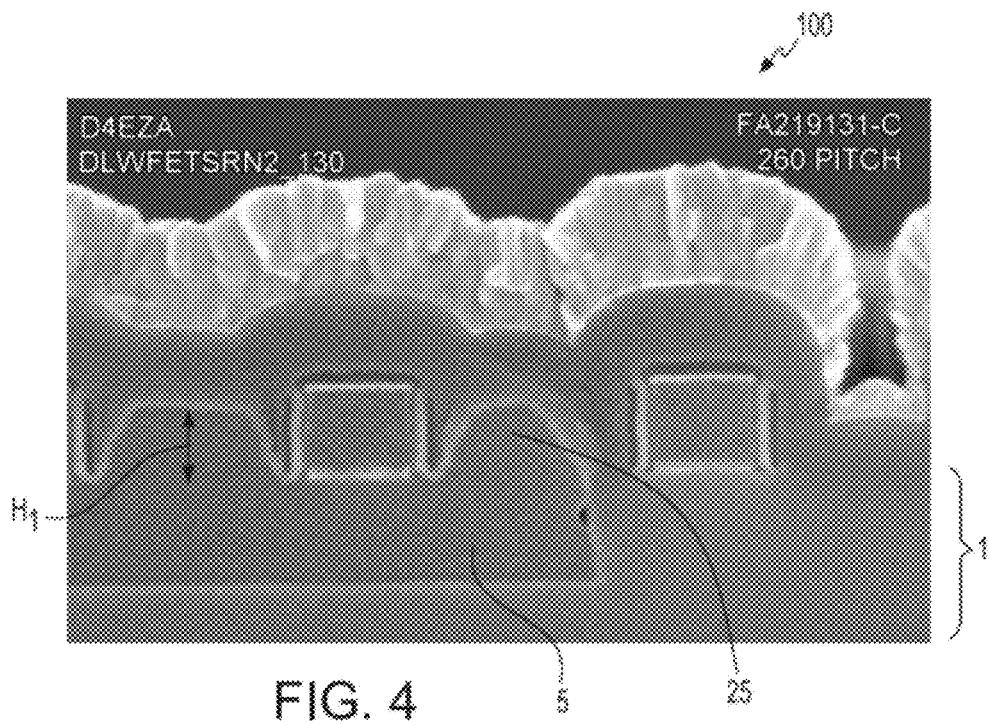
FIG. 4 is a micrograph depicting a side cross-sectional view depicting overgrowth of n-type conductivity silicon doped with carbon (Si:C) well regions that result from an epitaxial deposition process using a carrier gas composed of nitrogen ($N_2$).

Referring to FIG. 4, the (110) sidewall growth that results from epitaxial growth of n-type conductivity silicon doped with carbon (Si:C) well region 5 with a nitrogen (N$_2$) carrier gas typically provides an overgrowth 25 having a thickness having a height H1 greater than 10 nm over the upper surface of the semiconductor substrate 1. In some examples, the overgrowth 25 that results from the (110) sidewall growth has a thickness with a height H1 ranging from 10 nm to 100 nm over the upper surface of the semiconductor substrate 1.

Figure 5:
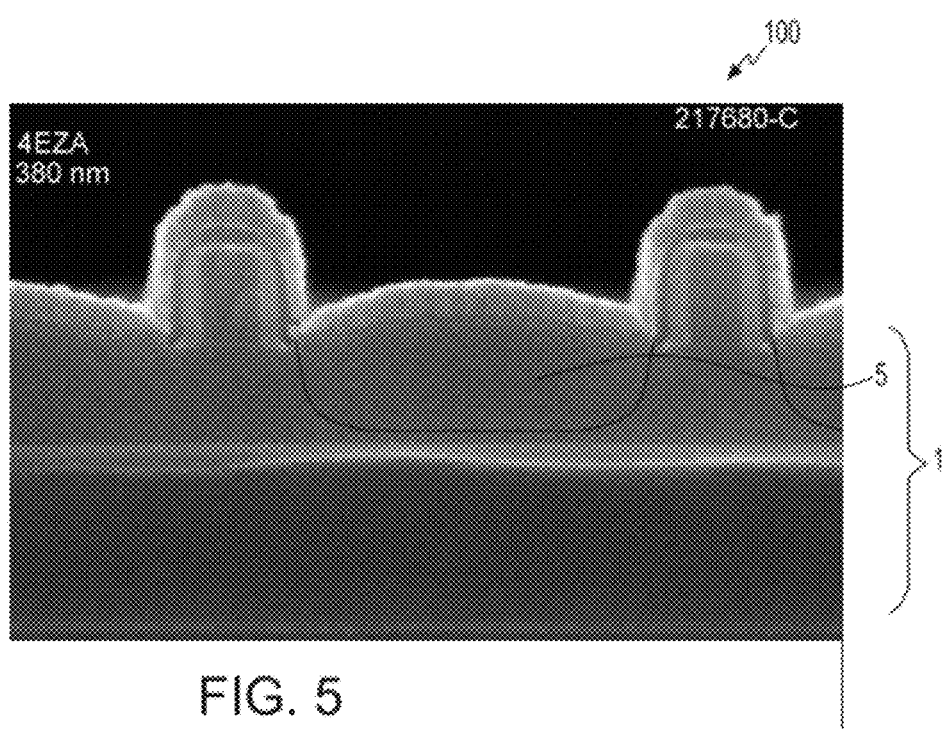
FIG. 5 is a micrograph depicting a side cross-sectional view depicting the degree of loading on a semiconductor device including well regions composed of an epitaxially formed n-type conductivity silicon doped with carbon (Si:C) that results from an epitaxial deposition process using a carrier gas composed of hydrogen ($H_2$), in accordance with one embodiment of the present disclosure.

In comparison to the overgrowth that results from the epitaxial growth of n-type conductivity silicon doped with carbon (Si:C) in a nitrogen (N$_2$) carrier gas, epitaxial growth of n-type conductivity silicon doped with carbon (Si:C) well regions 5 in a hydrogen (H$_2$) carrier gas produces substantially no overgrowth, as depicted in FIG. 5. Although not depicted in FIG. 5, in one embodiment, the epitaxial growth of n-type conductivity silicon doped with carbon (Si:C) in a hydrogen (H$_2$) carrier gas produces an overgrowth of epitaxially deposited semiconductor material that is no greater than 10 nm, as measured from the upper surface of the semiconductor substrate 1. In another embodiment, the epitaxial growth of n-type conductivity silicon doped with carbon (Si:C) in a hydrogen (H$_2$) carrier gas produces an overgrowth of epitaxially deposited semiconductor material that is no greater than 5 nm, as measured from the upper surface of the semiconductor substrate 1. In an even further embodiment, the epitaxial growth of n-type conductivity silicon doped with carbon (Si:C) in a hydrogen (H$_2$) carrier gas produces an overgrowth of epitaxially deposited semiconductor material that is no greater than 1 nm, as measured from the upper surface of the semiconductor substrate 1. In some embodiments, the hydrogen (H$_2$) of the carrier gas is absorbed on the sidewalls of the recesses in which the n-type conductivity silicon doped with carbon (Si:C) is being deposited, wherein the adsorbed hydrogen (H2) suppresses (110) sidewall growth.

By reducing the (110) sidewall growth and substantially eliminating the facets formed in the upper surface of the n-type conductivity silicon doped with carbon (Si:C) well regions 5, epitaxial deposition processes that employ hydrogen (H$_2$) carrier gas may increase the loading capability of the semiconductor device 100 including well regions 5 composed of the n-type conductivity silicon doped with carbon (Si:C) when compared to epitaxial deposition processes that employ carrier gasses composed of nitrogen (N$_2$). The loading is a measure of the material layers, such as stain inducing material layers, which may be deposited atop the semiconductor device 100. In one example, a semiconductor device 100 including well regions 5 composed of epitaxially deposited n-type conductivity silicon doped with carbon (Si:C) that is formed using a hydrogen (H$_2$) carrier gas has a loading that is 4× greater than a semiconductor device 100 including well regions 5 composed of epitaxially deposited n-type conductivity silicon doped with carbon (Si:C) formed using a nitrogen ($N_2$) carrier gas.

Figure 6:
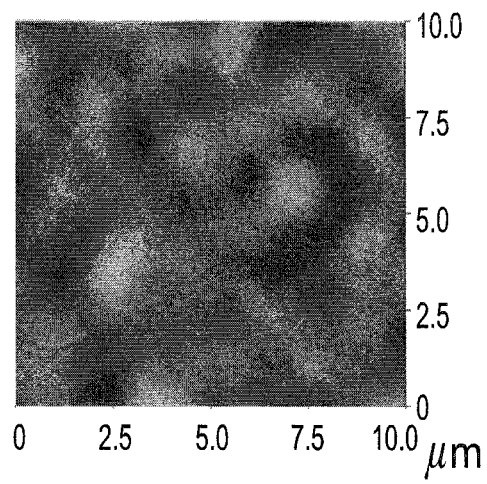
FIG. 6 is a micrograph depicting a top down view of a pitted surface of an n-type conductivity silicon doped with carbon (Si:C) well regions that are formed using a carrier gas composed of nitrogen ($N_2$).
Figure 7:
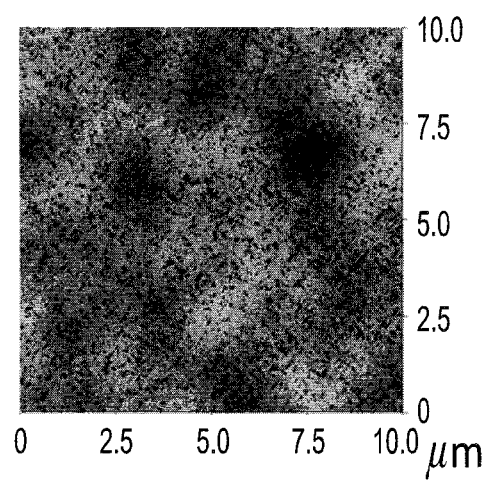
FIG. 7 is a micrograph depicting top down view of a non-pitted surface of an n-type conductivity silicon doped with carbon (Si:C) well regions that are formed using a carrier gas composed of hydrogen ($H_2$), in accordance with one embodiment of the present disclosure.

Referring to FIGS. 6 and 7, in one embodiment, the epitaxial growth process that uses a hydrogen ($H_2$) carrier gas provides well regions composed of n-type conductivity silicon doped with carbon (Si:C) having an upper surface with reduced pitting, in comparison to an epitaxial growth process that uses a nitrogen ($N_2$) carrier gas. FIG. 6 depicts the pitted surface of an n-type conductivity silicon doped with carbon (Si:C) that is formed using a carrier gas composed of nitrogen ($N_2$). In one example, the surface roughness that results from the epitaxial deposition of an n-type conductivity silicon doped with carbon (Si:C) material with a nitrogen ($N_2$) carrier gas is greater than 5 Å RMS. FIG. 7 depicts a non-pitted surface of an n-type conductivity silicon doped with carbon (Si:C) well region that is formed using a carrier gas composed of hydrogen ($H_2$). In one example, the surface roughness that results from the epitaxial deposition of an n-type conductivity silicon doped with carbon (Si:C) material with a hydrogen ($H_2$) carrier gas is less than 4 Å RMS. In another example, the surface roughness that results from the epitaxial deposition of an n-type conductivity silicon doped with carbon (Si:C) material with a hydrogen ($H_2$) carrier gas is less than 3 Å RMS. In yet another example, the surface roughness that results from the epitaxial deposition of an n-type conductivity silicon doped with carbon (Si:C) material with a hydrogen ($H_2$) carrier gas is less than 2.5 Å RMS.

Figure 8:
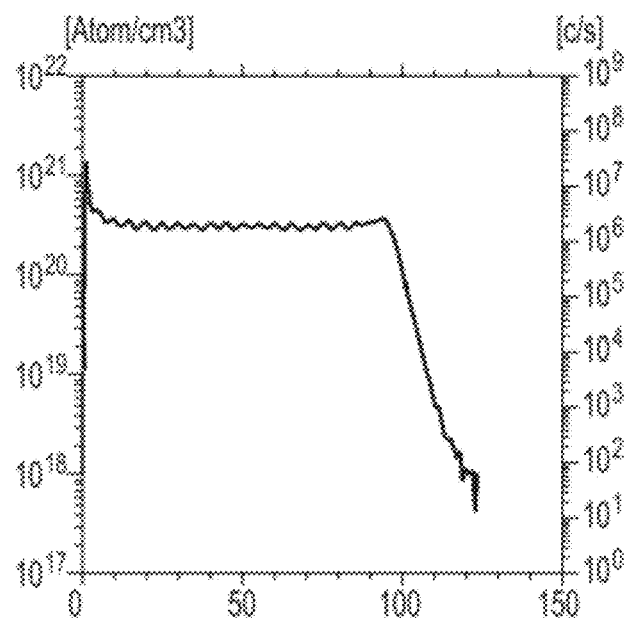
FIG. 8 is a plot of the phosphorus concentration as a function of depth in an n-type conductivity silicon doped with carbon (Si:C) well region that is formed using a carrier gas composed of nitrogen ($N_2$).

In one embodiment, the epitaxial growth process that uses a hydrogen ($H_2$) carrier gas provides independent control of the concentration of carbon and phosphorus in the n-type conductivity silicon doped with carbon (Si:C). Epitaxial growth processes of phosphorus and carbon doped silicon (Si:C) that employs a nitrogen ($N_2$) carrier gas typically cause the formation of clusters of phosphorus and carbon that are incorporated into the epitaxially formed n-type conductivity silicon doped with carbon (Si:C) well regions. The clusters of phosphorus and carbon make it difficult to independently control the phosphorous and carbon concentration in n-type conductivity silicon doped with carbon (Si:C) well regions that are formed using an epitaxial growth process that utilizes nitrogen ($N_2$) as a carrier gas. FIG. 8 is a plot of the phosphorus concentration as a function of depth in the n-type conductivity silicon doped with carbon (Si:C) that is formed using a carrier gas composed of nitrogen ($N_2$). The oscillations 35 measured in the phosphorus concentration in the plot depicted in FIG. 8 result from the clusters of phosphorus and carbon that are produced by epitaxial deposition processes that includes a nitrogen ($N_2$) carrier gas. The oscillations 35 in the phosphorus concentration that are depicted in FIG. 8 may range from 15% to 20% of the mean phosphorus concentration.

Figure 9:
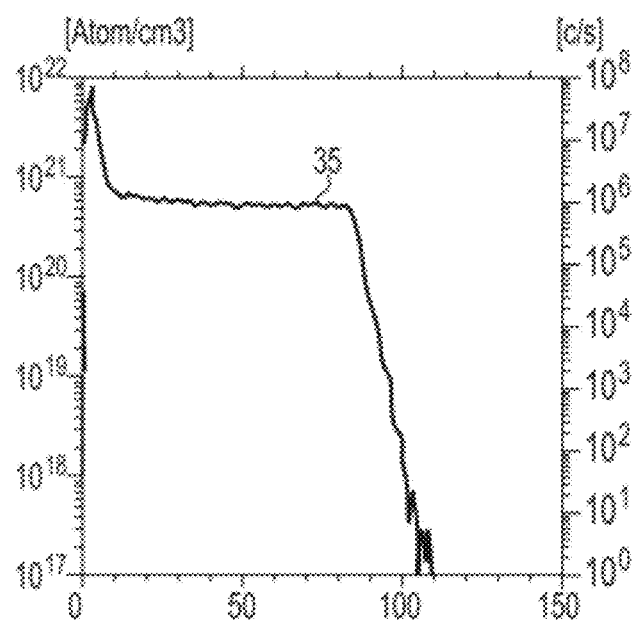
FIG. 9 is a plot of the phosphorus concentration as a function of depth in an n-type conductivity silicon doped with carbon (Si:C) well region that is formed using a carrier gas composed of hydrogen ($H_2$), in accordance with one embodiment of the present disclosure.

FIG. 9 is a plot of the phosphorus concentration as a function of depth in well regions that are composed of n-type conductivity silicon doped with carbon (Si:C) that are epitaxially formed using a carrier gas composed of hydrogen ($H_2$). The plot 35 of the phosphorus concentration is substantially free of oscillations. The hydrogen ($H_2$) carrier gas reduces the formation of clusters of carbon and phosphorus during epitaxial deposition of n-type conductivity silicon doped with carbon (Si:C) in comparison to similar epitaxial deposition processes employing a nitrogen ($N_2$) carrier gas. In some embodiments, the reduction in phosphorus and carbon cluster formation of epitaxial growth processes with hydrogen ($H_2$) carrier gas is provided by the reduction in reactive radicals that is provided by the hydrogen ($H_2$) carrier gas in comparison to the nitrogen ($N_2$) carrier gas.

$H_2$ carrier gas plays more of a catalytic role in the dissociation of $PH_3$ and Methylsilane (the carbon precursor). $N_2$ carrier gas on the other hand is an inert gas. The complete dissociation of $PH_3$ and Methysilane to P and C atoms/radicals in $H_2$ carrier gas allows for better independent control of these concentrations, as opposed to the case of $N_2$ carrier where there is a high probability of $PH_3$ and methysilane clustering together, thereby making independent control more difficult. Thermal activation of the decomposition reactions is easier in $H_2$ carrier gas, as opposed to $N_2$ carrier gas.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. An epitaxial deposition method comprising:
depositing an n-type conductivity silicon doped with carbon (Si:C) monocrystalline semiconductor material on a semiconductor deposition surface using a deposition gas precursor comprising a silane containing gas prescursor, a carbon containing gas precursor, and an n-type gas dopant source, wherein the deposition gas precursor is introduced to the semiconductor deposition surface with a hydrogen ($H_2$) carrier gas, wherein the hydrogen ($H_2$) carrier gas is introduced to the semiconductor deposition surface at a flow rate ranging from 10 slm to 50 slm, wherein the n-type conductivity silicon doped with carbon (Si:C) monocrystalline semiconductor material has a stacking defect density that ranges from $10^{12}$ defects/$cm^3$ to $10^{14}$ defects/$cm^3$;
etching epitaxial amorphous semiconductor material or epitaxial polysilicon selectively to the n-type conductivity silicon doped with carbon (Si:C) monocrystalline semiconductor material, wherein the etch reaction comprises hydrogen chloride (HCl) gas etchant, a pressure ranging from 250 Torr to 450 Torr, and a hydrogen ($H_7$) carrier gas, wherein the etch reaction comprises 80% hydrogen ($H_2$) carrier gas and 20% hydrogen chloride (HCl) gas etchant;
measuring a thickness of the n-type conductivity silicon doped with carbon (Si:C) monocrystalline semiconductor material; and
repeating steps of depositing the n-type conductivity silicon doped with carbon (Si:C) monocrystalline semiconductor material, the etching of the epitaxial amorphous semiconductor material or epitaxial polysilicon, and the measuring of the thickness of the n-type conductivity silicon doped with carbon (Si:C) until a measured thickness is equal to a predetermined thickness.

2. The epitaxial deposition method of claim 1, wherein the hydrogen chloride (HCl) gas etchant has a flow rate ranging from 10 sccm to 700 sccm.

3. The epitaxial deposition method of claim 1, wherein the etch reaction is conducted after the depositing of the n-type conductivity silicon doped with carbon (Si:C) monocrystalline semiconductor material.

4. The epitaxial deposition method of claim 1, wherein steps of the depositing of the n-type conductivity doped silicon carbon (Si:C) semiconductor material and the etch reaction are cycled.

5. The epitaxial deposition method of claim 4, wherein the hydrogen chloride (HCl) gas etchant is exposed to the epitaxial polysilicon and the epitaxial amorphous semiconductor material for a time period in the range of 10 seconds to 90 seconds.

6. The epitaxial deposition method of claim 1, wherein a temperature of the etch reaction is less than 750° C.

7. The epitaxial deposition method of claim 1, wherein each of the silane containing gas prescursor, the carbon containing gas precursor, and the n-type gas dopant source are exposed to the semiconductor deposition surface for a period of time ranging from 0.5 seconds to 30 seconds.

8. The epitaxial deposition method of claim 1, wherein silane containing gas precursor comprise silanes with the empirical formula $Si_xH_{(2x+2)}$, halogenated silanes with the empirical formula $X'_ySi_xH_{(2x+2-y)}$, where X'=F, Cl, Br or I, organosilane compounds with the empirical formula $R_ySi_xH_{(2x+2-y)}$, where R=methyl, ethyl, propyl or butyl, or combinations thereof.

9. The epitaxial deposition method of claim 1, wherein the silane containing gas precursor comprises at least one of silane ($SiH_4$), methylsilane ($H_3C-SiH_3$) and disilane ($Si_2H_6$).

10. The epitaxial deposition method of claim 1, wherein the silane containing gas precursor is introduced to the semiconductor deposition surface with a flow rate ranging from 5 sccm to 500 sccm.

11. The epitaxial deposition method of claim 1, wherein the carbon containing gas precursor comprises methylsilane ($CH_3SiH_3$), dimethylsilane (($CH_3)_2SiH_2$), ethylsilane ($CH_3CH_2SiH_3$), methane ($CH_4$), ethylene ($C_2H_4$), ethyne ($C_2H_2$), propane ($C_3H_8$), propene ($C_3H_6$), butyne ($C_4H_6$) or combinations thereof.

12. The epitaxial deposition method of claim 1, wherein the carbon containing gas precursor is introduced to the semiconductor deposition surface with a flow rate ranging from 0.2 sccm to 20 sccm.

13. The epitaxial deposition method of claim 1, wherein the n-type gas dopant source comprises arsine ($AsH_3$), phosphine ($PH_3$), trimethylphosphine (($CH_3)_3P$), dimethylphosphine (($CH_3)_2PH$), triethylphosphine (($CH_3CH_2)_3P$), diethylphosphine (($CH_3CH_2)_2PH$) or combinations thereof.

14. The epitaxial deposition method of claim 1, wherein the silane containing gas precursor and the carbon containing gas precursor of the deposition gas precursor are provided by a single composition.

15. The epitaxial deposition method of claim 14, wherein the single composition that provides the silane containing gas precursor and the carbon containing gas precursor is methylsilane ($CH_3SiH_3$).

* * * * *